United States Patent
Kitajima

(10) Patent No.: US 8,861,498 B2
(45) Date of Patent: Oct. 14, 2014

(54) HIGH-FREQUENCY MODULE

(75) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 344 days.

(21) Appl. No.: 13/326,387

(22) Filed: Dec. 15, 2011

(65) Prior Publication Data
US 2012/0087285 A1    Apr. 12, 2012

Related U.S. Application Data

(63) Continuation of application No. PCT/JP2010/060329, filed on Jun. 18, 2010.

(30) Foreign Application Priority Data

Jun. 19, 2009    (JP) .................................. 2009-145963

(51) Int. Cl.
| | | |
|---|---|---|
| H04B 1/40 | (2006.01) | |
| H01P 1/213 | (2006.01) | |
| H03H 7/46 | (2006.01) | |
| H03H 9/72 | (2006.01) | |
| H04B 1/18 | (2006.01) | |
| H04B 1/00 | (2006.01) | |
| H04B 1/04 | (2006.01) | |

(52) U.S. Cl.
CPC ............... *H01P 1/213* (2013.01); *H03H 7/465* (2013.01); *H03H 9/725* (2013.01); *H04B 1/0057* (2013.01); *H04B 1/0458* (2013.01); *H04B 1/18* (2013.01)
USPC ............... 370/339; 370/297; 455/19; 455/82; 455/83

(58) Field of Classification Search
USPC ................. 370/297, 339; 455/19, 82, 83, 139
See application file for complete search history.

(56) References Cited

U.S. PATENT DOCUMENTS

2004/0127182 A1\*    7/2004    Hayashi ..................... 455/193.1
2004/0224643 A1     11/2004    Nakai
(Continued)

FOREIGN PATENT DOCUMENTS

CN        1496021 A        5/2004
JP        2002-141764 A    5/2002
(Continued)

OTHER PUBLICATIONS

Official Communication issued in International Patent Application No. PCT/JP2010/060329, mailed on Aug. 24, 2010.

(Continued)

*Primary Examiner* — Hoon J Chung
(74) *Attorney, Agent, or Firm* — Keating & Bennett, LLP

(57) ABSTRACT

A high-frequency switch module includes a first diplexer arranged to receive a GPS signal and to send/receive a GSM 1800 communication signal and a GSM 1900 communication signal, and a switch element arranged to switch between the sending/receiving of the GSM 1800 and the sending/receiving of the GSM 1900 communication signal. A SAW filter having a passage band corresponding to the frequency band of the GSM 1900 communication signal and a SAW filter having a passage band corresponding to the frequency band of the GSM 1800 communication signal are connected to the switch element. A line length of a transmission line for connection to the SAW filter which provides a reflection phase closer to the open side for the GPS signal as viewed from the switch element is greater than that of a transmission line for connection to the other SAW filter.

6 Claims, 3 Drawing Sheets

(56) References Cited

U.S. PATENT DOCUMENTS

2004/0266378 A1* 12/2004 Fukamachi et al. ....... 455/188.1
2005/0206478 A1    9/2005 Satoh et al.

FOREIGN PATENT DOCUMENTS

| JP | 2003-087076 A | 3/2003 |
| JP | 2004-032673 A | 1/2004 |
| JP | 2004-040322 A | 2/2004 |
| JP | 2005-260837 A | 9/2005 |
| JP | 2005-268878 A | 9/2005 |
| JP | 2006-108824 A | 4/2006 |
| JP | 2006-211057 A | 8/2006 |

OTHER PUBLICATIONS

Official Communication issued in corresponding Chinese Patent Application No. 201080027209.7, mailed on Apr. 30, 2014.

* cited by examiner freq (1.500GHz to 2.300GHz)

freq (1.500GHz to 2.300GHz)

HIGH-FREQUENCY MODULE

BACKGROUND OF THE INVENTION

1. Field of the Invention

The present invention relates to a high-frequency module that sends and receives a plurality of types of high-frequency signals in a switchable manner.

2. Description of the Related Art

Hitherto, various types of high-frequency modules have been devised, each of which includes a plurality of SAW filters and can send and receive a plurality of communication signals in different frequency bands by using just one antenna. In that type of high-frequency module, unless a circuit for transmitting a communication signal in another different frequency band is designed to provide a phase of about 180° for the communication signal in the frequency band to be sent and received, a transmission loss of the communication signal in the frequency band to be sent and received is increased in the use of the high-frequency module. As one example of a method for solving the above-described problem, in a high-frequency module disclosed in Japanese Unexamined Patent Application Publication No. 2003-87076, a phase adjustment circuit is provided for phase adjustment in a line connecting the SAW filter and the side including a switch or a diplexer.

However, the high-frequency module disclosed in Japanese Unexamined Patent Application Publication No. 2003-87076 has a problem in that, because the phase adjustment circuit is formed over an entire multilayer component, a module size is increased when an additional element, such as a switch element, is further mounted to the high-frequency module.

Moreover, in the above-described type of high-frequency module, a filter element, such as a SAW filter, must be used for each of the plurality of frequency bands, and the filter element must have a characteristic corresponding to each of the plurality of frequency bands. When a communication signal in a predetermined frequency band differing from the frequency bands capable of passing through the filter elements is sent and received through another circuit branched from a circuit including those filter elements, the following problem arises.

Because the filter elements have different phase characteristics from each other, respective phase adjustment circuits must be provided so as not to degrade the passage characteristics of the filter elements, taking into account respective reflection phases of all of the filter elements with respect to the predetermined frequency band. Thus, design of the phase adjustment circuits becomes difficult and the module size is increased. Another problem is that, when attempting to form a plurality of phase adjustment circuits in a small-sized multilayer module as described above, elements defining the phase adjustment circuits are positioned close to each other and isolation between the adjacent phase adjustment circuits is degraded.

SUMMARY OF THE INVENTION

To overcome the problems described above, preferred embodiments of the present invention provide a high-frequency module having a simple structure and a small size, which can, even with a structure including a plurality of filter elements, reduce a loss of a communication signal in a predetermined frequency band differing from frequency bands capable of passing through the filter elements.

A preferred embodiment of the present invention provides a high-frequency module arranged to send and receive a plurality of types of communication signals in different frequency bands by using one antenna. The high-frequency module preferably includes a diplexer, a switch element, a first filter element, and a second filter element. The diplexer separates a communication signal in a first frequency band, a communication signal in a second frequency band, and a communication signal in a third frequency band. The switch element switches between sending/receiving of the first frequency band signal and sending/receiving of the second frequency band signal. The first filter element is preferably inserted between an input/output port for the first frequency band signal and the switch element, and it allows passage of the first frequency band therethrough. The second filter element is preferably inserted between an input/output port for the second frequency band signal and the switch element, and it allows passage of the second frequency band therethrough.

In the arrangement described above, when a first reflection phase of the first filter element in the third frequency band as viewed from the switch element and a second reflection phase of the second filter element in the third frequency band as viewed from the switch element are both capacitive on a Smith chart and the second reflection phase is located closer to a short-circuited side on the Smith chart than the first reflection phase, a line length of a first transmission line connecting the switch element and the first filter element is preferably greater than a line length of a second transmission line connecting the switch element and the second filter element.

The foregoing arrangement is designed in consideration of the fact that as the reflection phase of each switch element gets closer to the open side on the Smith chart, a transmission loss of the objective communication signal in the third frequency band is reduced and a passage characteristic thereof is improved, and that as the reflection phase of each switch element gets closer to the short-circuited side on the Smith chart, the transmission loss of the communication signal in the third frequency band is increased and the passage characteristic thereof is degraded. The respective reflection phases when looking the filter elements from the switch element can be prevented from getting closer to the short-circuited side to a large extent by setting the line length of the first transmission line between the switch element and the first filter element, which provides the reflection phase located closer to the open side when it is in the state of a single unit alone, to be greater than the line length of the second transmission line between the switch element and the second filter element, which provides the reflection phase located closer to the short-circuited side when it is in the state of a single unit alone. In addition, since the phase adjustment is performed only by the first transmission line and the second transmission line, the number of components of the high-frequency module is reduced.

In the high-frequency module according to a preferred embodiment of the present invention, the diplexer is preferably defined by elements mounted onto a circuit board and by circuit electrode patterns provided on the circuit board. The switch element, the first filter element, and the second filter element are preferably mounting-type elements that are mounted onto the circuit board. Further, the first transmission line and the second transmission line are preferably defined by electrode patterns that are arranged at different positions on the circuit board when looking at the circuit board from a side including a mounting surface for the mounting-type elements.

The foregoing arrangement represents a practical method of providing the above-described features of the high-frequency switch module from the viewpoint of module structure. By using the above-described circuit board, the shape of the circuit board is simplified and the high-frequency module has a reduced size. Further, since the respective electrode surfaces of the first transmission line and the second transmission line are preferably not arranged so as to face each other, isolation between the first transmission line and the second transmission line is improved and the desired reflection phase can be more easily achieved.

In the high-frequency module according to a preferred embodiment of the present invention, the diplexer is preferably defined by elements mounted onto a circuit board and by circuit electrode patterns provided on the circuit board. The switch element, the first filter element, and the second filter element are preferably mounting-type elements that are mounted onto the circuit board. The second transmission line is preferably defined by an electrode pattern that is provided on a mounting surface of the circuit board for the mounting-type elements. On the other hand, the first transmission line is preferably defined by an electrode pattern that is provided on the mounting surface of the circuit board for the mounting-type elements and an electrode pattern provided inside the circuit board.

With the arrangement described above, since the first transmission line preferably includes not only the electrode pattern on the mounting surface, but also the inner electrode, the line length of the first transmission line can be more easily increased than the line length of the second transmission line that is made of only electrode pattern on the mounting surface. Further, since the degree of freedom of a route pattern of the first transmission line is increased, the first and second transmission lines can be more easily routed while being less affected by the positional relationship between the switch element and each of the filter elements.

In the high-frequency module according to a preferred embodiment of the present invention, the first filter element and the second filter element are preferably mounted at locations spaced away from each other on the mounting surface.

With the arrangement described above, since the first filter element and the second filter element are spaced away from each other, isolation between the filter elements is effectively improved. Moreover, since the first filter element is mounted away from the second filter element, the difference in line length between the first transmission line and the second transmission line can be further increased by arranging the switch element at a location closer to the first filter element.

In the high-frequency module according to a preferred embodiment of the present invention, the first filter element and the second filter element are preferably SAW filters.

This feature represents a practical type of the first filter element and the second filter element.

In the high-frequency module according to a preferred embodiment of the present invention, a third filter element is preferably arranged between the first filter element and the second filter element on the mounting surface of the circuit board.

With the arrangement described above, since a third filter element is arranged between the first filter element and the second filter element, coupling between the first filter element and the second filter element is further minimized or prevented.

According to the features of various preferred embodiments of the present invention, a transmission loss is reduced when a communication signal in a predetermined frequency band differing from passage bands of a plurality of filter elements, which transmit communication signals in different frequency bands therethrough, is transmitted through another circuit that is branched from a circuit including those filter elements. As a result, a high-frequency module capable of sending and receiving the communication signals in the respective frequency bands through one antenna in a switchable manner with a small loss is achieved with a simple construction and a small size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high-frequency switch module according to preferred embodiments of the present invention will be described below with reference to the drawings.

Figure 1:
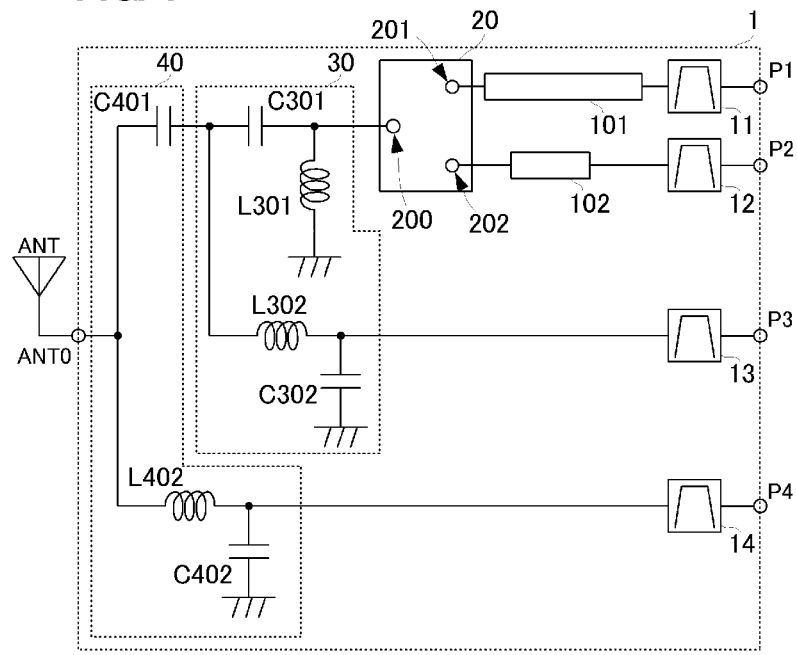
FIG. 1 is a circuit diagram of a high-frequency switch module 1 according to a preferred embodiment of the present invention.

FIG. 1 is a circuit diagram of a high-frequency switch module 1 according to a preferred embodiment of the present invention.

The high-frequency switch module 1 preferably includes SAW filters 11, 12, 13 and 14, a switch element 20, a first diplexer 30, and a second diplexer 40.

The high-frequency switch module 1 preferably includes an antenna connection port ANT0 and communication signal input/output ports P1, P2, P3 and P4.

An external antenna ANT is connected to the antenna connection port ANT0. The communication signal input/output ports P1, P2, P3 and P4 are ports through which communication signals in different frequency bands are input and output, respectively. For example, the communication signal input/output port P1 preferably inputs and outputs a GSM 1900 communication signal, and the communication signal input/output port P2 preferably inputs and outputs a GSM 1800 communication signal. The communication signal input/output port P3 preferably outputs a GPS signal, and the communication signal input/output port P4 preferably inputs and outputs a GSM 850 communication signal. The following description is provided in connection with a practical example using the GSM 1900 communication signal, the GSM 1800 communication signal, GPS signal, and the GSM 850 communication signal. It is to be noted that the GSM 1900 communication signal, the GSM 1800 communication signal, the GSM 850 communication signal, and GPS signal are signals having frequency bands of about 1900 MHz, about 1800 MHz, about 850 MHz, and about 1500 MHz, respectively.

In the high-frequency switch module 1, a second diplexer 40 is connected to the antenna connection port ANT0. The second diplexer 40 preferably includes a resonance circuit including a capacitor C401, an inductor L402, and a capacitor C402. The capacitor C401 and the inductor L402 are connected to each other, and a line connecting the capacitor C401 and the inductor L402 is connected to the antenna connection port ANT0. The capacitor C402 is connected between an end of the inductor L402 on the side opposite to the antenna connection port ANT0 and the ground. In the configuration described above, the capacitor C401 functions as a high-pass filter allowing passage of the GPS signal, the GSM 1900 communication signal, and the GSM 1800 communication signal therethrough. A resonance circuit including the inductor L402 and the capacitor C402 preferably functions as a low-pass filter allowing passage of the GSM 850 communication signal therethrough.

The SAW filter 14 is connected to the low-pass filter side of the second diplexer 40, i.e., to a junction between the inductor L402 and the capacitor C402. The SAW filter 14 is a filter having a passage band that corresponds to the frequency band of the GSM 850 communication signal. An end of the SAW filter 14 on the side opposite to the second diplexer 40 is connected to the communication signal input/output port P4.

The first diplexer 30 is connected to the high-pass filter side of the second diplexer 40, i.e., to an end of the capacitor C401 on the side opposite to the antenna connection port ANT0.

The first diplexer 30 preferably includes a resonance circuit including a capacitor C301 and an inductor L301, and a resonance circuit including an inductor L302 and a capacitor C302. A line connecting the capacitor C301 and the inductor L302 is connected to the capacitor C401 of the second diplexer 40. The inductor L301 is connected between an end of the capacitor C301 on the side opposite to the side connected to the second diplexer 40 and the ground. The capacitor C302 is connected between an end of the inductor L302 on the side opposite to the side connected to the second diplexer 40 and the ground. In the configuration described above, the resonance circuit including the capacitor C301 and the inductor L301 preferably functions as a high-pass filter allowing passage of the GSM 1900 communication signal and the GSM 1800 communication signal therethrough. The resonance circuit including the inductor L302 and the capacitor C302 preferably functions as a low-pass filter allowing passage of the GPS signal therethrough.

The SAW filter 13 is connected to the low-pass filter side of the first diplexer 30, i.e., to a junction between the inductor L302 and the capacitor C302. The SAW filter 13 is a filter having a passage band that corresponds to the frequency band of the GPS signal. An end of the SAW filter 13 on the side opposite to the first diplexer 30 is connected to the communication signal input/output port P3.

The switch element 20 is connected to the high-pass filter side of the first diplexer 30, i.e., to a junction between the capacitor C301 and the inductor L301.

The switch element 20 connects a plurality of select ports 201 and 202 to a common port 200 in a switchable manner in accordance with a control voltage signal that is externally applied. The common port 200 of the switch element 20 is connected to the high-pass filter side of the first diplexer 30, i.e., to the junction between the capacitor C301 and the inductor L301.

The first select port 201 of the switch element 20 is connected to the SAW filter 11 through the transmission line 101. The SAW filter 11 preferably has a passage band that corresponds to the frequency band of the GSM 1900 communication signal, for example. An end of the SAW filter 11 on the side opposite to the switch element 20 is connected to the communication signal input/output port P1.

The second select port 202 of the switch element 20 is connected to the SAW filter 12 through the transmission line 102. The SAW filter 12 preferably has a passage band that corresponds to the frequency band of the GSM 1800 communication signal, for example. An end of the SAW filter 12 on the side opposite to the switch element 20 is connected to the communication signal input/output port P2.

With the circuit configuration described above, the GSM 850 communication signal is transmitted between the antenna connection port ANT0 and the communication signal input/output port P4 through the second diplexer 40. Also, the GPS signal is transmitted between the antenna connection port ANT0 and the communication signal input/output port P3 through the first diplexer 30 and the second diplexer 40.

Further, the GSM 1800 communication signal is transmitted between the antenna connection port ANT0 and the communication signal input/output port P2 through the switch element 20, the first diplexer 30, and the second diplexer 40 in a state in which the common port 200 and the second select port 202 are controlled to be connected to each other by the switch element 20.

Still further, the GSM 1900 communication signal is transmitted between the antenna connection port ANT0 and the communication signal input/output port P1 through the switch element 20, the first diplexer 30, and the second diplexer 40 in a state in which the common port 200 and the first select port 201 are controlled to be connected to each other by the switch element 20.

In the circuit configuration described above, a reflection phase when looking at the side including the switch element 20 from the first diplexer 30 is preferably adjusted such that the GPS signal is not leaked from the first diplexer 30 to the side including the switch element 20. In the high-frequency switch module 1 according to this preferred embodiment, therefore, the line length of the transmission line 101 connecting the switch element 20 and the SAW filter 11 and the line length of the transmission line 102 connecting the switch element 20 and the SAW filter 12 are set to be different from each other, as appropriate, in order to adjust the reflection phase. One reason why such adjustment is to be made is because the reflection phases of the SAW filter 11 and the SAW filter 12 are both capacitive in the frequency band of the GPS signal separated by the first diplexer 30, the reflection phases can be improved by adjusting the respective line lengths of the transmission lines 101 and 102, each of which functions as an inductor. Another reason why such adjustment is preferably made is that the switch element 20 itself does not have a line length that causes a significant phase change, and the adjustment of the reflection phase is required for both of the SAW filter 11 for the GSM 1900 communication signal and the SAW filter 12 for the GSM 1800 communication signal, the SAW filters 11 and 12 differing in characteristics from each other.

In this preferred embodiment, for example, the line length of the transmission line 101 is preferably set to be greater than that of the transmission line 102 based on the following theory.

Figure 2A:
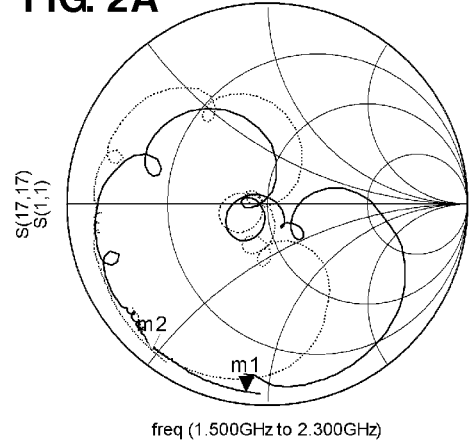
FIGS. 2A and 2B represent a single-unit characteristic of each of a SAW filter 11 and a SAW filter 12, and a change in characteristics when a transmission line having a set line length is arranged for adjustment of a reflection phase between a switch element and each of the SAW filters.
Figure 2B:
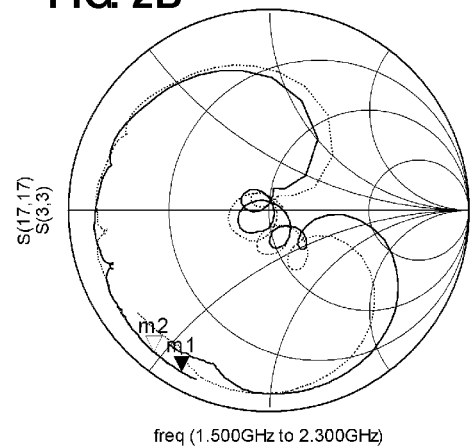

FIGS. 2A and 2B represent a single-unit characteristic of each of the SAW filter 11 and the SAW filter 12, and changes in characteristics when a transmission line having a set line length is provided to adjust the reflection phase between the switch element 20 and each of the SAW filters. In FIGS. 2A and 2B, a dotted line represents a Smith chart indicative of a reflection characteristic when looking at the side including each SAW filter from the switch element 20 in a state in which each SAW filter alone is connected, and a solid line represents a Smith chart indicative of a reflection characteristic when looking at the side including each SAW filter from the switch element 20 in a state in which each transmission line is added. Further, a marker denoted in each Smith chart represents the reflection phase at the frequency of the GPS signal. More specifically, an inverted black triangle marker (▼) represents the reflection phase of the SAW filter alone, and an inverted white triangle marker (∇) represents the reflection phase in the state in which the transmission line is provided.

FIG. 2A represents the reflection characteristic of the SAW filter 11, and FIG. 2B represents the reflection characteristic of the SAW filter 12. As seen from the reflection characteristics of FIGS. 2A and 2B, the SAW filter alone provides the reflection phase that is closer to the short-circuited side on the Smith chart in the SAW filter 11 than in the SAW filter 12. Therefore, when the two SAW filters having those reflection characteristics are used, the SAW filter 12 is arranged closer to the switch element 20 than the SAW filter 11 and the transmission line 101 between the switch element 20 and the SAW filter 11 is configured to be longer than the transmission line 102 between the switch element 20 and the SAW filter 12.

With this arrangement, the reflection phase at the frequency of the GPS signal when looking at the side including the SAW filter 11 from the switch element 20 is shifted towards the short-circuited side on the Smith chart.

On the other hand, since the transmission line 102 between the switch element 20 and the SAW filter 12 is configured to be shorter than the transmission line 101, a change rate of the reflection phase at the frequency of the GPS signal when looking at the side including the SAW filter 12 from the switch element 20 is smaller than that of the reflection phase when looking at the side including the SAW filter 11 from the switch element 20.

Thus, by setting the line length of the transmission line 101 connected to the SAW filter 11 to be greater than that of the transmission line 102 connected to the SAW filter 12 as described above, it is possible to avoid a further deviation of the reflection phase of the SAW filter 12 that has a poorer reflection phase characteristic for the GPS signal in terms of the SAW filter alone than the SAW filter 11, and to make the reflection phase of the SAW filter 11, which has a better reflection phase characteristic for the GPS signal in terms of the SAW filter alone than the SAW filter 12, comparable to the reflection phase of the SAW filter 12. As a result, although the reflection phase provided to the GPS signal by the SAW filter 11 is deviated at a greater rate than the reflection phase provided to the GPS signal by the SAW filter 12, the high-frequency switch module 1 can be provided as a whole with an improved reflection phase characteristic for the GPS signal, taking into consideration the line length of the transmission line which is not practically ignorable from the viewpoint of configuring the circuits.

Figure 3:
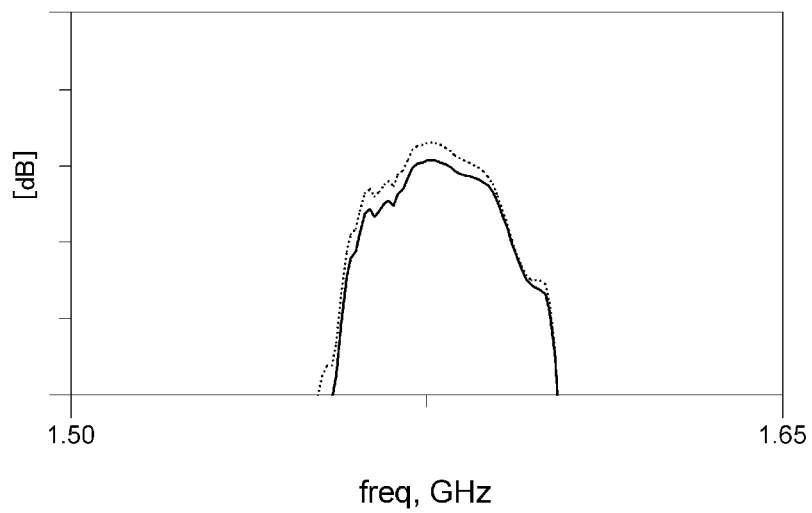
FIG. 3 is a characteristic graph representing passage characteristics between an antenna connection port and a communication signal input/output port (i.e., a GPS signal input/output port) when the line length of a transmission line is set to be greater than that of a transmission line and when the line length of the transmission line is set to be less than that of the transmission line on the condition that characteristics on the Smith chart are given as represented in FIGS. 2A and 2B.

FIG. 3 is a characteristic graph representing passage characteristics between the antenna connection port ANT0 and the communication signal input/output port P3 (i.e., the GPS signal input/output port) when the line length of the transmission line 101 is set to be greater than that of the transmission line 102 and when the line length of the transmission line 101 is set to be less than that of the transmission line 102 (conversely speaking, when the line length of the transmission line 102 is set greater than that of the transmission line 101) on condition that characteristics on the Smith chart are provided as represented in FIG. 2. In the graph of FIG. 3, a solid line represents the case in which the line length of the transmission line 101 is less than that of the transmission line 102, and a dotted line represents the case in which the line length of the transmission line 101 is greater than that of the transmission line 102.

As seen in FIG. 3, the passage characteristic is improved by setting the line length of the transmission line 101 to be greater than that of the transmission line 102.

It is to be noted that the line lengths of the transmission lines 101 and 102 are set in consideration of not only the frequency band of the GPS signal, but also the phase adjustment between the switch element 20 and the SAW filter 11 for the GSM 1900 communication signal and the phase adjustment between the switch element 20 and the SAW filter 12 for the GSM 1800 communication signal. As a result, an improved passage characteristic can be obtained for each of the GPS signal, the GSM 1900 communication signal, and the GSM 1800 communication signal.

In addition, the above-described improvements of the reflection phase and the passage characteristic can be achieved by using only the two transmission lines 101 and 102 and by adjusting the line lengths thereof. Accordingly, a high-frequency switch module capable of sending and receiving communication signals in a plurality of frequency bands through one antenna with good characteristics can be achieved with a simple construction and a small size.

Figure 4:
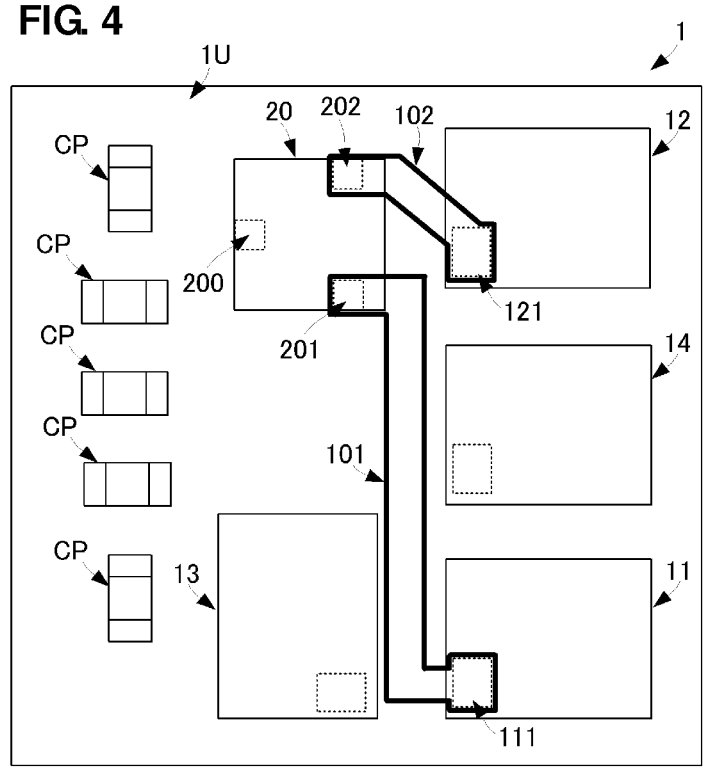
FIG. 4 is a schematic view illustrating the mounting layout of the high-frequency switch module according to a preferred embodiment of the present invention.

A mechanical structure of the high-frequency switch module 1 having the above-described circuit configuration will be described below with reference to FIG. 4. FIG. 4 is a schematic view illustrating the mounting layout of the high-frequency switch module 1 according to a preferred embodiment of the present invention.

The high-frequency switch module 1 according to this preferred embodiment preferably includes electrode patterns provided in a multilayer circuit board, which is fabricated by stacking a plurality of insulating layers, and with components mounted on the multilayer circuit board. In more detail, the electrode patterns defining the above-described circuit patterns are preferably provided on an upper surface 1U and inner layers of the multilayer circuit board. Further, lands to mount various discrete components, which define the above-described circuits of the high-frequency switch module 1, are preferably provided on the upper surface 1U of the multilayer circuit board. The land to mount the switch element 20 is preferably arranged close to the land to mount the SAW filter 12, and the land to mount the SAW filter 11 is preferably arranged away from the lands to mount the switch element 20 and the SAW filter 12. The lands to mount the SAW filters 13 and 14 are also preferably provided on the upper surface 1U of the multilayer circuit board. Moreover, the lands to mount the capacitors and the inductors, which define the circuits illustrated in FIG. 1, are also provided thereon.

Preferably, the switch element 20 is mounted on the land for the switch element 20, and the SAW filters 11 to 14 are mounted on the lands for the SAW filter 11 to 14, respectively. The capacitors and the inductors defined by individual discrete chip components are preferably mounted to the corresponding lands for the capacitors and the inductors, respectively. As an alternative, the capacitors and the inductors may be defined by inner electrodes in the multilayer circuit board.

In the above-described arrangement, a land for the first select port 201 of the switch element 20 and a land for a connection terminal 111 of the SAW filter 11 to the switch element 20 are preferably connected to each other through an electrode pattern, whereby the transmission line 101 illustrated in FIG. 1 is provided.

Also, a land for the second select port 202 of the switch element 20 and a land for a connection terminal 121 of the SAW filter 12 to the switch element 20 are preferably connected to each other through an electrode pattern, whereby the transmission line 102 illustrated in FIG. 1 is provided.

Further, since, as described above, the land for the switch element 20 and the land for the SAW filter 12 are preferably arranged close to each other and the land for the SAW filter 11 is preferably arranged to be spaced away from those two lands, the electrode pattern defining the transmission line 101 is longer than that forming the transmission line 102. Accordingly, the line length of the transmission line 101 can be set to be greater than that of the transmission line 102 as described above. Further, the reflection phase and the passage characteristic of the high-frequency switch module 1 for the GPS signal are improved by properly setting the line lengths of the transmission lines 101 and 102 while maintaining the above-described relationship between the line lengths of the transmission lines 101 and 102.

Moreover, since the electrode pattern defining the transmission line 101 and the electrode pattern defining the transmission line 102 are provided on the upper surface 1U of the multilayer circuit board, these electrode patterns are not configured such that their electrode surfaces are arranged to face each other in the stacking direction of the multilayer circuit board. Thus, isolation between the electrode pattern defining the transmission line 101 and the electrode pattern defining the transmission line 102 is more reliably ensured, whereby the reflection phase and the passage characteristic can be further improved. Also, stray capacitance is not required to be taken into consideration, and the design to obtain the improved characteristics is facilitated.

Since the SAW filter 11 and the SAW filter 12 are preferably arranged to be spaced away from each other, isolation between those two SAW filters is improved.

In addition, since the other SAW filter 13 differing from the SAW filters 11 and 12 is arranged between the SAW filter 11 and the SAW filter 12 on the mounting surface, element-to-element electromagnetic coupling between a first filter element and a second filter element, and electromagnetic coupling between the mounting lands are further minimized or prevented. As a result, the isolation between the SAW filter 11 and the SAW filter 12 is further improved.

Figure 5:
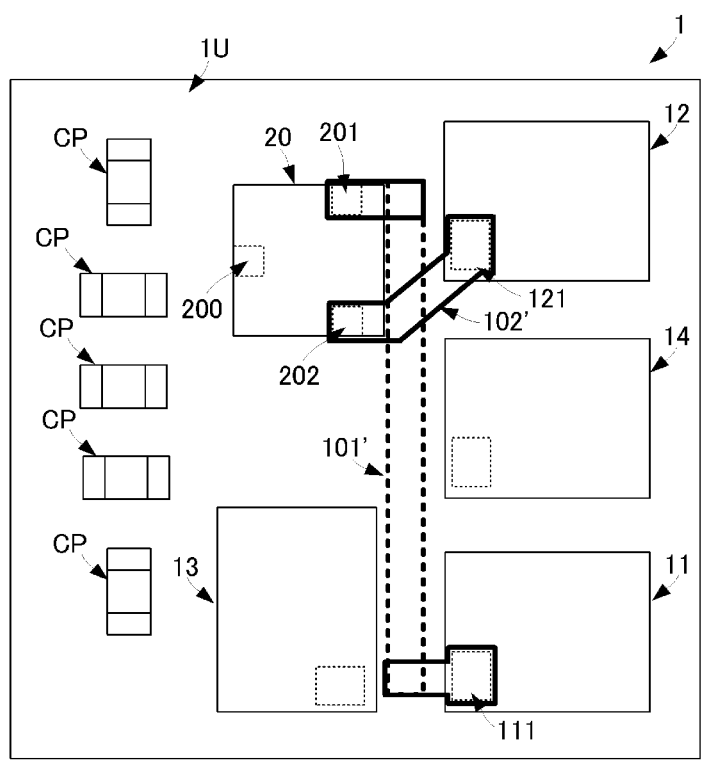
FIG. 5 is a schematic view to explain the mounting layout including a pattern of a transmission line that is defined by an inner electrode of a multilayer circuit board.

While the foregoing description is made in connection with an example in which the transmission line 101 and the transmission line 102 are both preferably provided on the upper surface 1U of the multilayer circuit board, the transmission line that has a longer length may preferably include an inner electrode of the multilayer circuit board. FIG. 5 is a schematic view to explain the mounting layout including a pattern of a transmission line 101' that includes an inner electrode of the multilayer circuit board.

As illustrated in FIG. 5, the transmission line 101' whose length is to be relatively increased preferably includes electrode pattern portions provided on the upper surface 1U, a portion defined by an inner electrode, and via holes connecting the electrode pattern portions and the inner electrode portion in the stacking direction of the multilayer circuit board. On the other hand, a transmission line 102' whose length is to be relatively reduced preferably includes electrode patterns provided only on the upper surface 1U. With such an arrangement, the transmission line 101' and the transmission line 102' can be routed such that both of the transmission lines are not in contact with each other while they intersect when viewed from the side including the upper surface 1U. Accordingly, even when the land for the first select port 201 is located farther from the SAW filter 11 than the land for the second select port 202 as illustrated in FIG. 5, the transmission lines 101' and 102' can have simple circuit electrode patterns. Further, the line length of the transmission line 101' can be more easily increased as compared to the line length of the transmission line 102' by including the transmission line 101' in a plurality layers and by including the transmission line 102' in only one layer. As a result, the transmission lines 101' and 102' can be more easily designed and configured.

The above-described isolation between the transmission lines can be further improved by forming the transmission line 101' in a plurality of layers such that the transmission line 101' and the transmission line 102' do not intersect as viewed in the stacking direction.

While the foregoing description is made in connection with an example using the SAW filters, the above-described arrangement can be similarly applied to high-frequency switch modules using other types of filter elements insofar as the high-frequency switch module includes a plurality of filter elements having different frequency bands as passage bands, a switch circuit, and a diplexer.

Further, while the foregoing description is made, by way of example, in connection with the high-frequency switch module that switches over the GSM 1900 communication signal, the GSM 1800 communication signal, the GPS signal, and the GSM 850 communication signal while using one antenna, the communication signals may be optionally selected in a combination of other suitable frequencies.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module that sends and receives a plurality of types of communication signals in different frequency bands by using one antenna, the high-frequency module comprising:

a diplexer arranged to separate a communication signal in a first frequency band, a communication signal in a second frequency band, and a communication signal in a third frequency band received from the one antenna;

a switch element arranged to switch between sending/receiving of the first frequency band signal and sending/receiving of the second frequency band signal; and a first filter element provided between an input/output port for the first frequency band signal and the switch element and allowing passage of the first frequency band therethrough, and a second filter element provided between an input/output port for the second frequency band signal and the switch element and allowing passage of the second frequency band therethrough; wherein when a first reflection phase of the first filter element in the third frequency band as viewed from the switch element and a second reflection phase of the second filter element in the third frequency band as viewed from the switch element are both capacitive on a Smith chart and the second reflection phase is closer to a short-circuited side on the Smith chart than the first reflection phase, a line length of a first transmission line configured to adjust the first reflection phase and connecting the switch element and the first filter element is longer than a line length of a second transmission line configured to adjust the second reflection phase connecting the switch element and the second filter element; and the first transmission line and the second transmission line are further configured such that the first reflection phase of the first filter element and the second reflection phase of the second element are shifted towards the short-circuited side on the Smith chart.

2. The high-frequency module according to claim 1, wherein the diplexer includes elements mounted on a circuit board and circuit electrode patterns provided on the circuit board;

the switch element, the first filter element, and the second filter element are mounting-type elements mounted on the circuit board; and the first transmission line and the second transmission line include electrode patterns that are arranged at different locations on the circuit board when viewing the circuit board from a side including a mounting surface for the mounting-type elements.

3. The high-frequency module according to claim 1, wherein the diplexer includes elements mounted on a circuit board and circuit electrode patterns provided on the circuit board;

the switch element, the first filter element, and the second filter element are mounting-type elements mounted on the circuit board;

the second transmission line includes an electrode pattern provided on a mounting surface of the circuit board for the mounting-type elements; and the first transmission line includes an electrode pattern provided on the mounting surface of the circuit board for the mounting-type elements and an electrode pattern provided inside the circuit board.

4. The high-frequency module according to claim 1, wherein the first filter element and the second filter element are mounted at locations spaced away from each other on a mounting surface of a circuit board.

5. The high-frequency module according to claim 1, wherein the first filter element and the second filter element are SAW filters.

6. The high-frequency module according to claim 1, wherein a third filter element is arranged between the first filter element and the second filter element on a mounting surface of a circuit board.

* * * * *